(12) United States Patent
Greeley et al.

(10) Patent No.: US 9,159,780 B2
(45) Date of Patent: *Oct. 13, 2015

(54) METHODS OF FORMING CAPACITORS

(71) Applicant: Micron Technology, Inc., Boise, ID (US)

(72) Inventors: Joseph Neil Greeley, Boise, ID (US); Prashant Raghu, Boise, ID (US); Niraj B. Rana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/596,429

(22) Filed: Jan. 14, 2015

(65) Prior Publication Data

US 2015/0126016 A1 May 7, 2015

Related U.S. Application Data

(63) Continuation of application No. 13/332,816, filed on Dec. 21, 2011, now Pat. No. 8,946,043.

(51) Int. Cl.
*H01L 21/02* (2006.01)
*H01L 49/02* (2006.01)
*H01L 21/3213* (2006.01)
*H01L 27/108* (2006.01)

(52) U.S. Cl.
CPC .......... *H01L 28/92* (2013.01); *H01L 21/32133* (2013.01); *H01L 27/108* (2013.01); *H01L 28/90* (2013.01); *H01L 27/10852* (2013.01)

(58) Field of Classification Search
CPC ......... H01L 28/40; H01L 28/90; H01L 28/92; H01L 27/108; H01L 27/32133; H01L 27/10852; H01L 27/10817; H01L 27/0207; H01L 27/10897

See application file for complete search history.

(56) References Cited

U.S. PATENT DOCUMENTS 8,518,788 B2 * 8/2013 Lee ............................. 438/381
2012/0040507 A1 2/2012 Lee

* cited by examiner

*Primary Examiner* — Savitr Mulpuri
(74) *Attorney, Agent, or Firm* — Wells St. John, P.S.

(57) ABSTRACT

A method of forming capacitors includes forming support material over a substrate. A first capacitor electrode is formed within individual openings in the support material. A first etching is conducted only partially into the support material using a liquid etching fluid to expose an elevationally outer portion of sidewalls of individual of the first capacitor electrodes. A second etching is conducted into the support material using a dry etching fluid to expose an elevationally inner portion of the sidewalls of the individual first capacitor electrodes. A capacitor dielectric is formed over the outer and inner portions of the sidewalls of the first capacitor electrodes. A second capacitor electrode is formed over the capacitor dielectric.

19 Claims, 4 Drawing Sheets

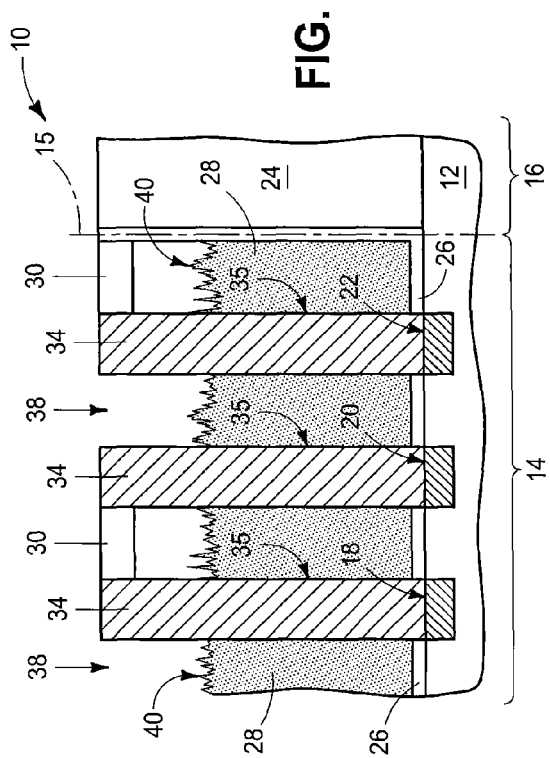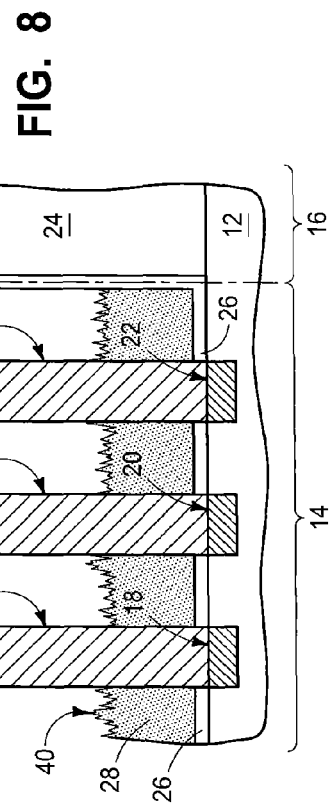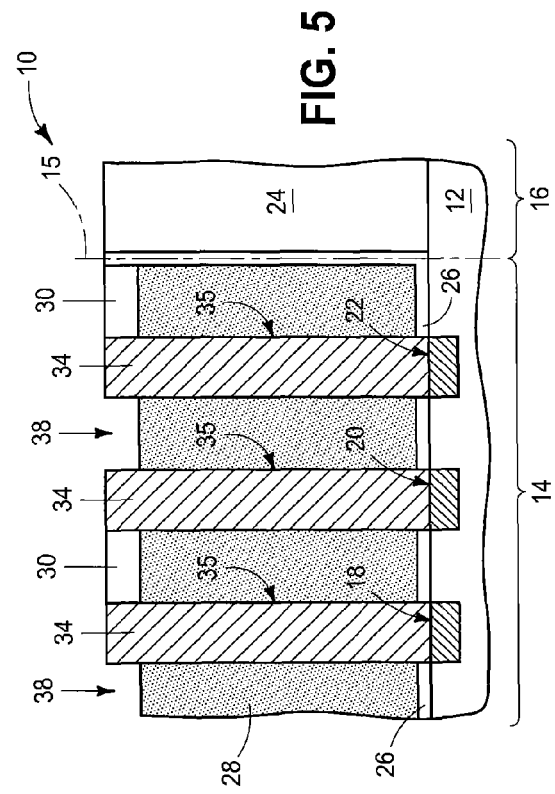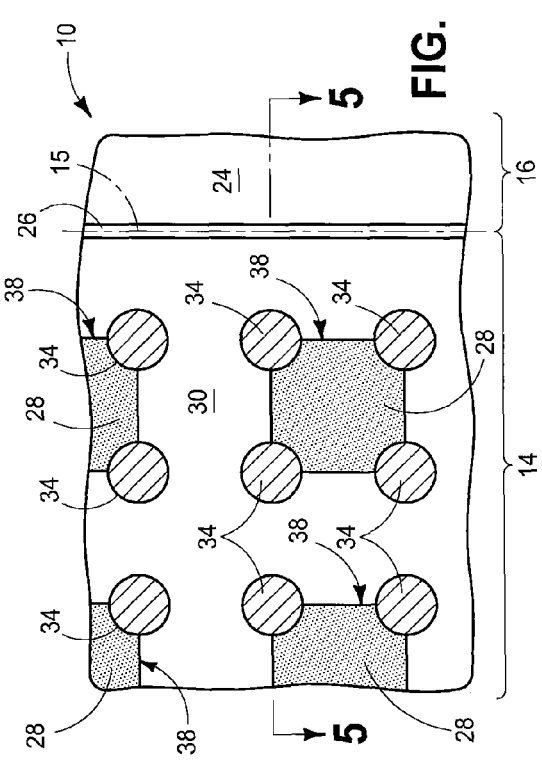

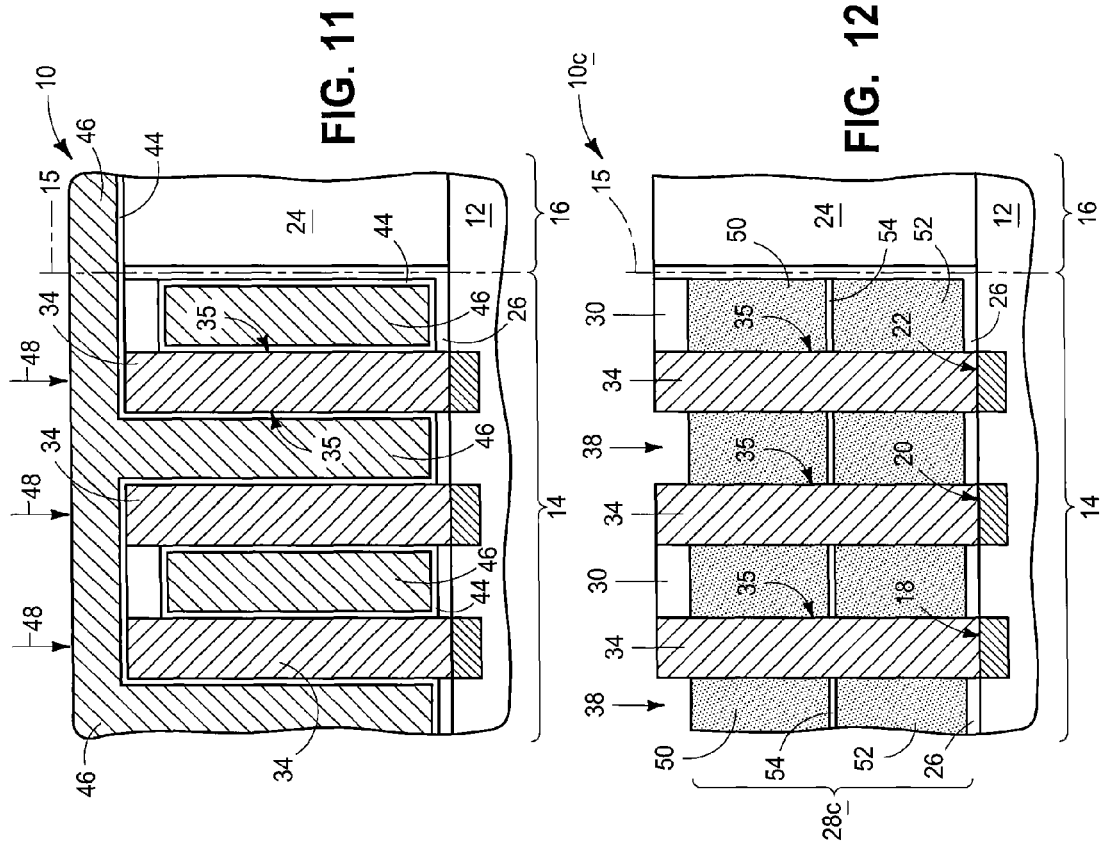
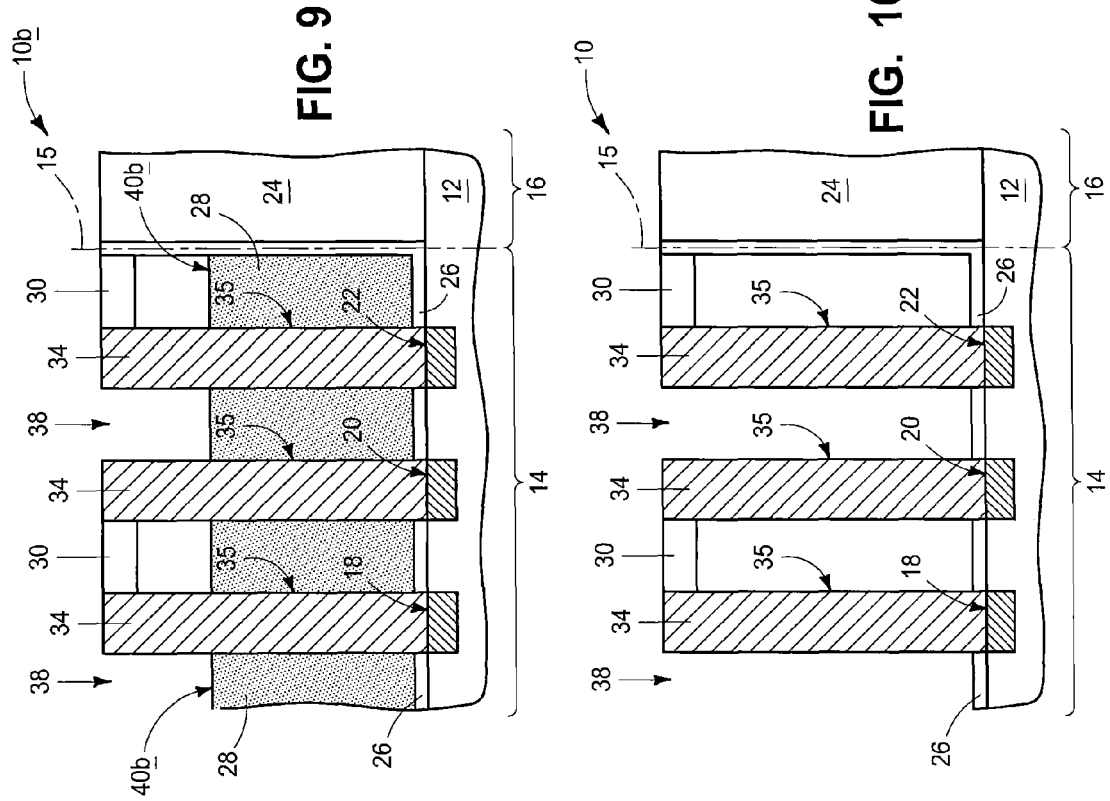

METHODS OF FORMING CAPACITORS

RELATED PATENT DATA

This patent resulted from a continuation application of U.S. patent application Ser. No. 13/332,816, filed Dec. 21, 2011, entitled "Methods of Forming Capacitors", naming Joseph Neil Greeley, Prashant Raghu, and Niraj B. Rana as inventors, the disclosure of which are incorporated by reference

TECHNICAL FIELD

Embodiments disclosed herein pertain to methods of forming capacitors.

BACKGROUND

Capacitors are one type of component used in the fabrication of integrated circuits, for example in DRAM and other memory circuitry. A capacitor is comprised of two conductive electrodes separated by a non-conducting dielectric region. As integrated circuitry density has increased, there is a continuing challenge to maintain sufficiently high storage capacitance despite decreasing capacitor area. The increase in density has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage electrode is formed. For example, an array of capacitor electrode openings for individual capacitors may be fabricated in an insulative support material, with an example material being silicon dioxide doped with one or both of phosphorus and boron. Openings within which some or all of the capacitors are formed are etched into the support material. It can be difficult to etch such openings through the support material, particularly where the openings are deep.

Further and regardless, it is often desirable to etch away most if not all of the capacitor electrode support material after individual capacitor electrodes have been formed within the openings. This enables outer sidewall surfaces of the electrodes to provide increased area and thereby increased capacitance for the capacitors being formed. However, capacitor electrodes formed in deep openings are often correspondingly much taller than they are wide. This can lead to toppling of the capacitor electrodes during etching to expose the outer sidewalls surfaces, during transport of the substrate, during deposition of the capacitor dielectric layer, and/or outer capacitor electrode layer. U.S. Pat. No. 6,667,502 teaches the provision of a brace or retaining structure intended to alleviate such toppling. Other aspects associated in the formation of a plurality of capacitors, some of which include bracing structures, have also been disclosed, such as in:

U.S. Pat. No. 7,067,385;
U.S. Pat. No. 7,125,781;
U.S. Pat. No. 7,199,005;
U.S. Pat. No. 7,202,127;
U.S. Pat. No. 7,387,939;
U.S. Pat. No. 7,439,152;
U.S. Pat. No. 7,517,753;
U.S. Pat. No. 7,544,563;
U.S. Pat. No. 7,557,013;
U.S. Pat. No. 7,557,015;
U.S. Patent Publication No. 2008/0090416;
U.S. Patent Publication No. 2008/0206950;
U.S. Pat. No. 7,320,911;
U.S. Pat. No. 7,682,924; and
U.S. Patent Publication No. 2010/0009512.

Fabrication of capacitors in memory circuitry may include forming an array of capacitors within a capacitor array area. Control or other circuitry area is often displaced from the capacitor array area, and the substrate may include an intervening area between the capacitor array area and the control or other circuitry area.

BRIEF DESCRIPTION OF THE DRAWINGS

FIG. 5 is a view of the FIG. 4 substrate at a processing stage subsequent to that of FIG. 4.

FIG. 6 is a diagrammatic top view of the FIG. 5 substrate comprising the cross-section shown in FIG. 5 along the line 5-5.

FIG. 7 is a view of the FIG. 5 substrate at a processing stage subsequent to that of FIG. 5.

FIG. 8 is a diagrammatic, cross-sectional view of a portion of a semiconductor substrate in process in accordance with an embodiment of the invention.

FIG. 9 is a diagrammatic, cross-sectional view of a portion of a semiconductor substrate in process in accordance with an embodiment of the invention.

FIG. 10 is a view of the FIG. 7 substrate at a processing stage subsequent to that of FIG. 7.

FIG. 11 is a view of the FIG. 10 substrate at a processing stage subsequent to that of FIG. 10.

FIG. 12 is a diagrammatic, cross-sectional view of a portion of a semiconductor substrate in process in accordance with an embodiment of the invention.

DETAILED DESCRIPTION OF EXAMPLE EMBODIMENTS

Figure 1:
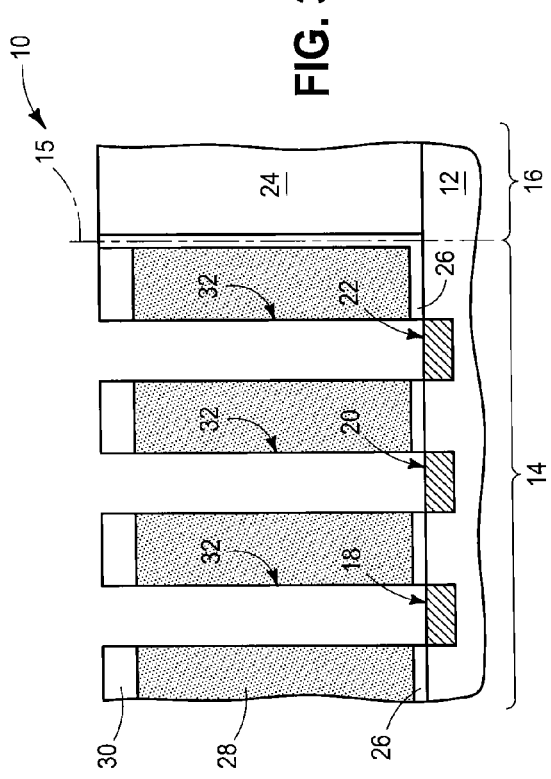
FIG. 1 is a diagrammatic, cross-sectional view of a portion of a semiconductor substrate at a preliminary processing stage of an embodiment in accordance with the invention.
Figure 2:
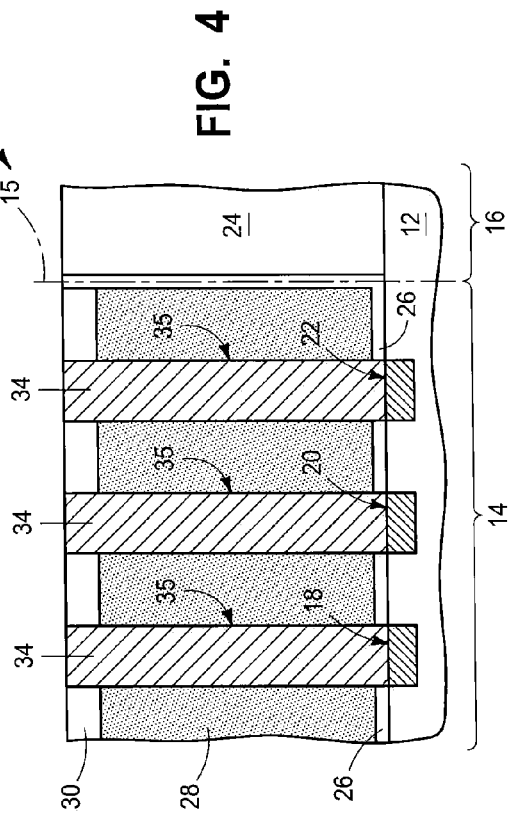
FIG. 2 is a diagrammatic top view of a portion of the semiconductor substrate comprising the cross-section shown in FIG. 1 along the line 1-1.

Example methods of forming capacitors in accordance with embodiments of the invention are described with reference to FIGS. 1-16. Referring initially to FIGS. 1 and 2, a construction 10 is shown at a preliminary processing stage of an embodiment. Construction 10 includes a substrate 12 which may comprise semiconductive material. To aid in interpretation of the claims that follow, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 may comprise a capacitor array area 14 and a peripheral circuitry area 16. An interface line 15 has been used in the drawings as an example interface of capacitor array area 14 and peripheral circuitry area 16. Logic circuitry may be fabricated within peripheral circuitry area 16. Control and/or other peripheral circuitry for operating a memory array may or may not be fully or partially within array area 14, with an example memory array area 14 as a minimum encompassing all of the memory cells of a given memory array/sub-memory array. Further, multiple sub-arrays might also be fabricated and operated independently, in tandem, or otherwise relative one another. As used herein, a "sub-array" or "sub-memory array" may be considered as an array. Various circuit devices (not shown) may be associated with peripheral circuitry area 16, as well as with capacitor array area 14, at the processing stage of FIGS. 1 and 2.

Electrically conductive node locations 18, 20, and 22 are shown within memory array area 14. Node locations 18, 20, and 22 may correspond to, for example, conductively-doped diffusion regions within a semiconductive material of substrate 12, and/or to conductive pedestals associated with substrate 12. Although the node locations are shown to be electrically conductive at the processing stage of FIG. 1, the electrically conductive materials of the node locations could be provided at a processing stage subsequent to that of FIG. 1. The node locations may ultimately be electrically connected with transistor or other constructions (not shown), may correspond to source/drain regions of transistor constructions, or may be ohmically connected to source/drain regions of transistor constructions. As an alternate example, the node locations may correspond to, connect to, or be parts of conductive interconnect lines. Regardless, as used herein, "node locations" refers to the elevationally outermost surfaces to which first capacitor electrodes electrically connect, for example as described below.

Dielectric material 24 may be over peripheral circuitry area 16. Such may be homogenous or non-homogenous, with doped silicon dioxide such as phosphosilicate glass (PSG) and borophosphosilicate glass (BPSG) being examples. Dielectric material 24 may be formed by blanket deposition over substrate 12, and then removed by subtractive patterning from array circuitry area 14. An example thickness range for dielectric material 24 is from about 0.5 micron to about 3 microns.

Dielectric material 26 may be formed elevationally over substrate 12 and/or node locations 18, 20, and 22. Dielectric material 26 may be homogenous or non-homogenous, with silicon nitride and undoped silicon dioxide being examples. An example thickness range for dielectric material 26 is from about 50 Angstroms to about 300 Angstroms.

A support material 28 has been formed elevationally over substrate 12 within capacitor array area 14. In one embodiment where dielectric material 26 is provided, support material 28 may be directly against dielectric material 26. In this document, a material or structure is "directly against" another when there is at least some physical touching contact of the stated materials or structures relative one another. In contrast, "over", "on", and "against" not proceeded by "directly", encompass "directly against" as well as constructions where intervening material(s) or structure(s) result(s) in no physical touching contact of the stated materials or structures relative one another. Support material 28 may be homogenous or non-homogenous, and may be any one or more of dielectric, conductive, or semiconductive. For example, support material 28 may be a single homogenous layer of a dielectric, conductive or semiconductive material; multiple layers of a single homogenous dielectric, conductive, or semiconductive material; or multiple layers of differing compositions of dielectric, conductive, and or semiconductive materials. An example support material comprises silicon, for example amorphous, monocrystalline, and/or polycrystalline silicon whether doped or undoped. One particular ideal material is polycrystalline silicon whether doped or undoped, and regardless of method of deposition. An example thickness for support material 28 is from about 0.25 micron to about 3 microns.

A covering material 30 may be formed elevationally over support material 28, and may be directly against support material 28. Covering material 30 may be any one or more of dielectric, conductive, or semiconductive, with a dielectric composition being ideal where covering material 30 remains as part of the finished circuitry construction. When dielectric, covering material 30 may be of the same composition or of different composition from that of dielectric material 26. An example thickness for covering material 30 is from about 600 Angstroms to about 1,500 Angstroms.

Materials 26, 28, and 30 of construction 10 in FIGS. 1 and 2 may be formed by deposition of respective layers of such materials to desired thicknesses over substrate 12 and material 24. Materials 26, 28, and 30 may then be planarized back at least to the outermost surface of dielectric material 24. Regardless, the above described processing is but one example of forming support material over a substrate. Alternate techniques may be used, and dielectric material 24, dielectric material 26, and/or covering material 30 may not be used.

Figure 3:
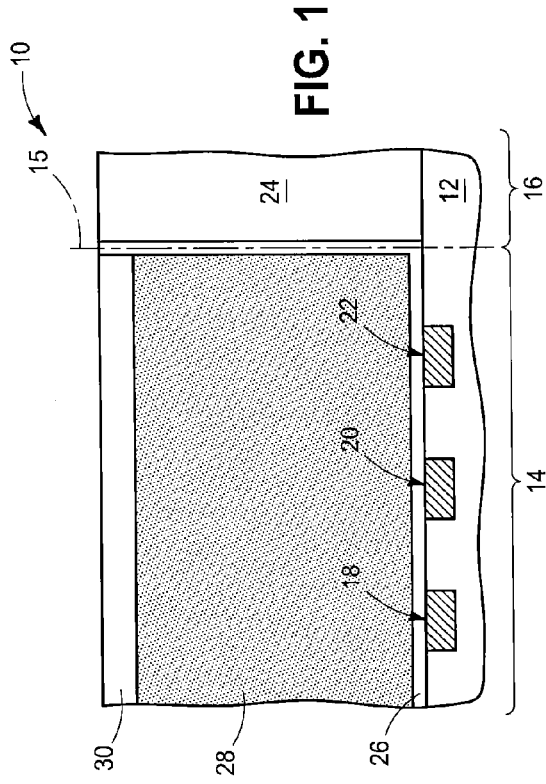
FIG. 3 is a view of the FIG. 1 substrate at a processing stage subsequent to that of FIG. 1.

Referring to FIG. 3, individual capacitor openings 32 have been formed through covering material 30, support material 28, and dielectric material 26 to node locations 18, 20, and 22. An example technique for forming openings 32 includes photolithographic patterning and anisotropic etch. Multiple etching chemistries may be used for etching materials 30, 28, and 26 as selected by the artisan. An example for support material 28 where such comprises doped or undoped polysilicon includes $NF_3:O_2:HBr$ at a volumetric ratio of 1:1:3 to 5. Alternate examples for anisotropically etching polysilicon include substituting $SF_6$ or $Cl_2$ for the $NF_3$, and in such events providing an alternate volumetric ratio of 1:1:1.

Figure 4:
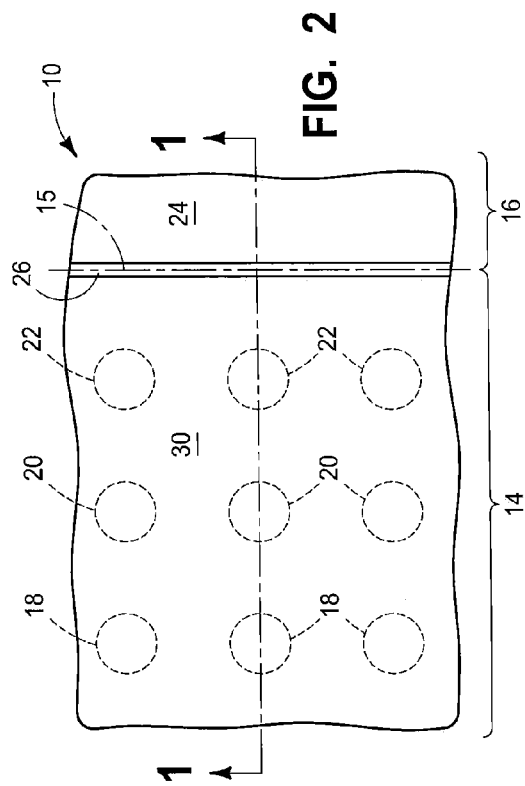
FIG. 4 is a view of the FIG. 3 substrate at a processing stage subsequent to that of FIG. 3.

Referring to FIG. 4, a first capacitor electrode 34 has been formed within individual openings 32 in support material 28. In the depicted example, electrodes 34 also extend through covering material 30 and dielectric material 26 into conductive electrical connection with respective node locations 18, 20, and 22. First capacitor electrodes 34 may be homogenous or non-homogenous, and may be of any suitable shape(s) with a solid pillar-like shape being shown. First capacitor electrodes 34 may be formed by depositing one or more conductive materials to overfill openings 32, followed by planarizing the conductive material back at least to the outermost surface of covering material 30. Example conductive materials are one or combinations of titanium, titanium nitride, and ruthenium. First capacitor electrodes may be considered as comprising sidewalls 35.

Referring to FIGS. 5 and 6, openings 38 have been anisotropically etched through covering material 30 to expose support material 28.

Referring to FIG. 7, first etching has been conducted only partially into support material 28 using a liquid etching fluid to expose an elevationally outer portion of sidewalls 35 (e.g., more of such sidewalls if already exposed) of individual first capacitor electrodes 34. Ideally, such etching is conducted isotropically particularly where a covering material 30 having openings 38 formed there-through is received over support material 28. In one embodiment, the first etching forms support material 28 to have a non-planar elevationally outmost surface 40, and which in one embodiment is jagged (i.e., having irregular projections and indentations on such outermost surface). Any suitable liquid etching fluid may be used. An example liquid etching fluid where support material 28 compromises doped or undoped polysilicon is aqueous tetramethylammonium hydroxide (TMAH). As a specific example, such may constitute from about 1% to about 5% by weight tetramethylammonium hydroxide with the remainder being water, and etching conditions at from about room temperature to about 80° C. at ambient pressure.

In one embodiment, the first etching exposes less than one-half of all of sidewalls 35 of individual first capacitors 34. FIG. 8 depicts an alternate example construction 10a wherein the first etching has been conducted to expose more than one-half of all of sidewalls 35 of individual first capacitors 34. Like numerals from the first described embodiment have been used where appropriate, with some construction differences being indicated by the suffix "a".

FIG. 9 illustrates an alternate example construction 10b wherein the first etching forms support material 28 to have a planar elevationally outermost surface 40b. Like numerals from the above-described embodiments have been used where appropriate, with some construction differences being indicated with the suffix "b". A substantially planar elevationally outermost surface might be attained when etching polysilicon, for example, using etching temperatures below about 30° C. Additionally or alternately, an etch-stop layer might be used to achieve planarity, for example as described below. Also, while FIG. 9 shows the first etching as exposing less than one-half of all of sidewalls 35 of individual first capacitor electrodes 34, the first etching may be conducted to expose one-half or more than one-half of all such sidewalls.

Referring to FIG. 10, second etching has been conducted into support material 28 (not shown) using a dry etching fluid to expose an elevationally inner portion of sidewalls 35 (e.g., more of such sidewalls) of individual first capacitor electrodes 34. Reference herein to "first" and "second" with respect to acts of etching is only temporally with respect to each other. In other words, other etching may occur before the first etching, after the second etching, or between the stated first and second etchings. Ideally, the second etching using the dry etching fluid is conducted isotropically particularly where covering material 30 having openings 38 formed there-through is used. Plasma may be used. An example suitable etching chemistry and etching conditions for etching a polysilicon-comprising support material 28 with a dry etching fluid include a combination of $F_2$, HF, and $NH_3$ with each being provided at flow rates from about 100 sccm to about 1,000 sccm, with a volumetric flow ratio of $F_2$ to a sum of $F_2$ and $NH_3$ being from about 0.3 to about 1.0. An example temperature range for isotropically etching with such a dry etching fluid is from about 80° C. to about 150° C. and a pressure from about 1 Torr to about 4 Torr, with 120° C. and 2 Torr being a specific example. Using plasma, an example chemistry includes $NF_3$, with a specific example being $NF_3$ at from about 20 sccm to about 1,000 sccm, power at from about 500 W to about 3,000 W, zero bias, temperature at from about −10° C. to about 50° C., and subatmospheric pressure. The second etching may remove all remaining of support material 28 (not shown) from surrounding individual first capacitor electrodes 34 as is shown, or may remove less than all of such remaining support material (not shown).

Referring to FIG. 11, a capacitor dielectric 44 is provided over the outer and inner portions of sidewalls 35. Such may be homogenous or non-homogenous. A second capacitor electrode 46 is formed over capacitor dielectric 44, thereby forming individual capacitors 48. Second capacitor electrode 46 may be homogenous or non-homogenous, and may be of the same composition or of different composition from that of first capacitor electrodes 34. Second capacitor electrode 46 is shown as being a single capacitor electrode common to the individual capacitors, although separate or other multiple second capacitor electrodes may be used. Likewise, capacitor dielectric 44 may be continuously or discontinuously received over multiple first capacitor electrodes 34.

Appropriate circuitry (not shown) would be associated with capacitor electrodes 46 and 34 of capacitors 48 to enable selective operation of individual capacitors 48. This other circuitry is not material to embodiments of this invention, and may be existing or later developed circuitry within the skill of the artisan.

Other example methods of forming capacitors in accordance with embodiments of the invention are next described with reference to FIGS. 12-16 and constructions 10c and 10d. Like numerals from the above described embodiments have been used where appropriate, with some construction differences being indicated with the suffix "c", the suffix "d", or different numerals. Referring to FIG. 12 with respect to construction 10c, support material 28c has been formed to comprise an elevationally outer material 50, an elevationally inner material 52, and an elevationally intermediate material 54 between materials 50 and 52. An example thickness for intermediate material 54 is from about 10 Angstroms to about 100 Angstroms. Intermediate material 54 may be of different composition from that of outer material 50 and inner material 52. Materials 50, 54, and 52 may be homogenous or non-homogenous. In one embodiment, outer material 50 and inner material 52 comprise polysilicon whether doped or undoped. Example materials 54 in such instances include one or both of silicon nitride or silicon dioxide.

FIG. 12 shows a processing of construction 10c in sequence the same as that of FIG. 5 with respect to construction 10. Openings 38 have been anisotropically etched through covering material 30 to expose outer support material 50.

Figure 13:
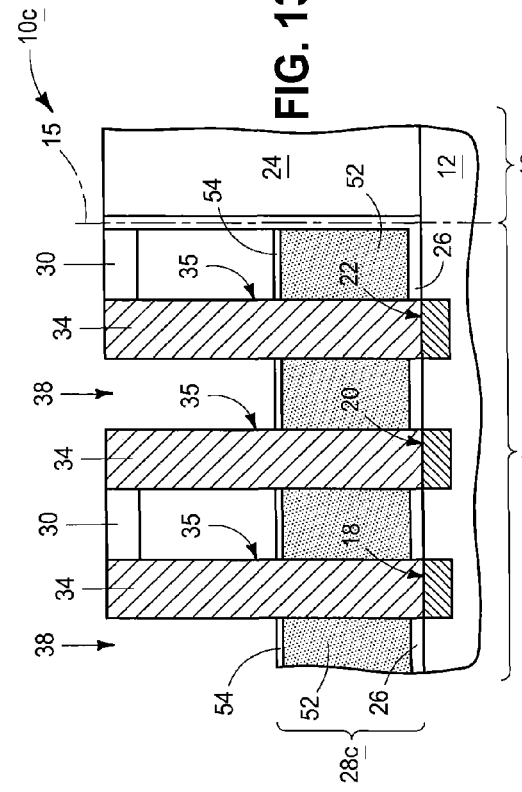
FIG. 13 is a view of the FIG. 12 substrate at a processing stage subsequent to that of FIG. 12.

Referring to FIG. 13, first etching has been conducted through outer support material 50 (not shown) using a liquid etching fluid to expose an elevationally outer portion of sidewalls 35 of individual first capacitor electrodes 34. The etching has also been conducted to expose and stop on (i.e., atop or within) intermediate support material 54. The above example TMAH liquid etching fluid may be used to etch polysilicon selectively relative to an oxide or nitride-comprising intermediate material 54, as an example. Regardless, ideally the first etching with the liquid fluid etching solution is conducted isotropically with respect to elevationally outer support material 50.

Figure 14:
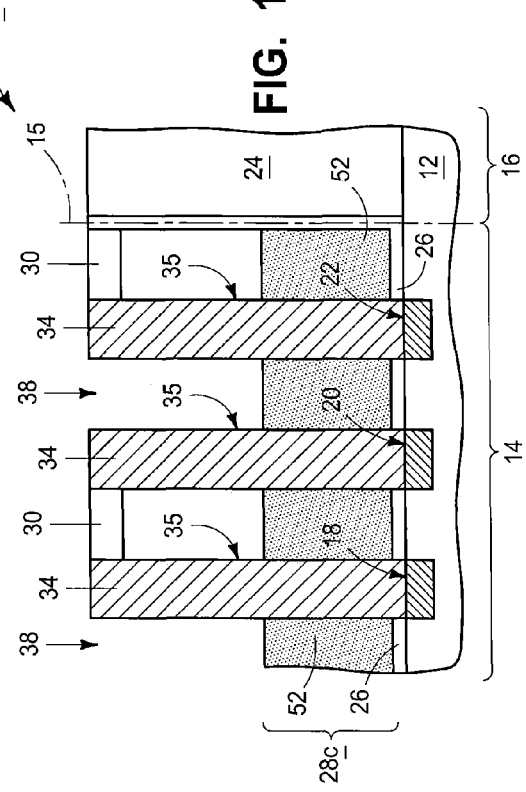
FIG. 14 is a view of the FIG. 13 substrate at a processing stage subsequent to that of FIG. 13.

After conducting the first etching, at least some of the intermediate support material is removed to expose inner support material 52. FIG. 14 shows an example embodiment wherein all of intermediate support material 54 (not shown) has been removed to expose inner support material 52. Such act of removing may be conducted by dry and/or wet etching techniques. An example wet etching technique for removing intermediate support material 52 where such comprises silicon dioxide is an aqueous HF solution. Where such comprises silicon nitride, an example etching solution is aqueous $H_3PO_4$.

Figure 15:
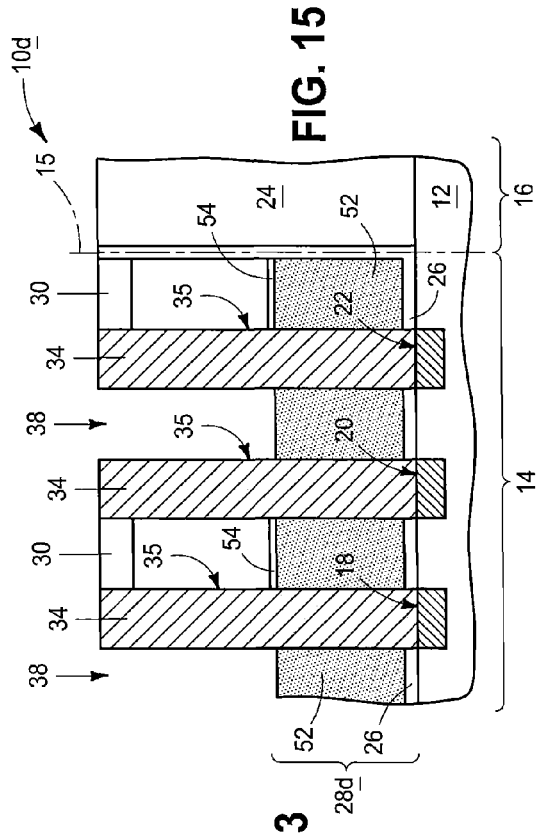
FIG. 15 is a diagrammatic, cross-sectional view of a portion of a semiconductor substrate in process in accordance with an embodiment of the invention.

FIG. 15 shows an alternate example embodiment where only some of intermediate material 54 that surrounds individual first capacitor electrodes 34 has been removed in a construction 10d. The partial removal may be conducted, for example, by an anisotropic dry etch of intermediate material 54 through openings 38 in covering material 30. In one such embodiment, some remaining intermediate material 54 may remain as part of a finished circuitry construction that comprises the capacitors. An example anisotropic dry etching chemistry for removing an intermediate silicon dioxide material 54 where such underlies openings 38 includes $NH_3$ flow from about 20 sccm to about 700 sccm, HF flow from about 20 sccm to about 700 sccm, temperature from about 20° C. to about 150° C., and pressure from about 1 Torr. Plasma may be used.

Figure 16:
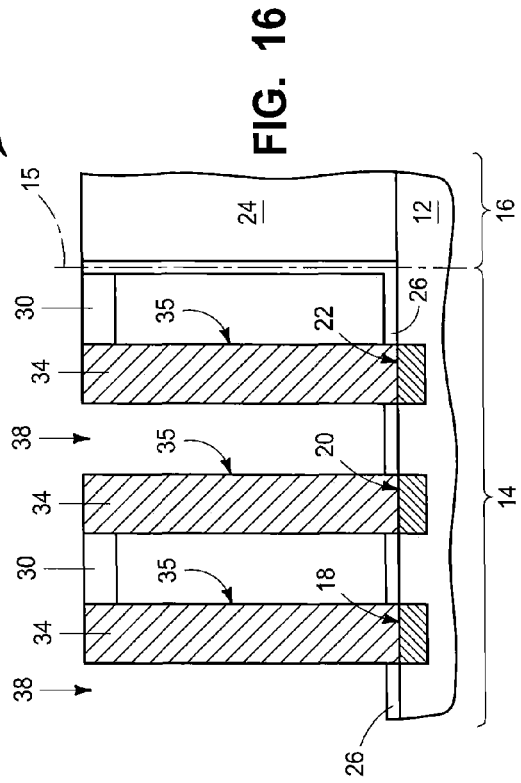
FIG. 16 is a view of the FIG. 14 substrate at a processing stage subsequent to that of FIG. 14.

Referring to FIG. 16 and subsequent to FIG. 14, a second etching has been conducted of inner support material 52 (not shown) using a dry etching fluid to expose an elevationally inner portion of sidewalls 35 of individual first capacitor electrodes 34. The second etching may be conducted to remove all of the inner support material as shown, or may be conducted to remove less than all (not shown) of the inner support material. In one embodiment, the second etching may be conducted to stop on dielectric material 26, and in one embodiment may be conducted isotropically. Subsequent processing may be conducted to produce a construction like that of FIG. 11, or other constructions.

Conclusion

In some embodiments, a method of forming capacitors comprises forming support material over a substrate. A first capacitor electrode is formed within individual openings in the support material. A first etching is conducted only partially into the support material using a liquid etching fluid to expose an elevationally outer portion of sidewalls of individual of the first capacitor electrodes. A second etching is conducted into the support material using a dry etching fluid to expose an elevationally inner portion of the sidewalls of the individual first capacitor electrodes. A capacitor dielectric is formed over the outer and inner portions of the sidewalls of the first capacitor electrodes. A second capacitor electrode is formed over the capacitor dielectric.

In some embodiments, a method of forming capacitors comprises forming dielectric material elevationally over node locations. Support material comprising polysilicon is formed elevationally over the dielectric material. Covering material is formed elevationally over the polysilicon-comprising support material. Individual openings are formed through the covering, support, and dielectric materials to the node locations. A first capacitor electrode is formed within individual of the openings in conductive electrical connection with the respective node locations. Openings are anisotropically etched though the covering material to expose the polysilicon-comprising support material. A first isotropic etching is conducted only partially into the support material using a liquid etching fluid to expose an elevationally outer portion of sidewalls of individual of the first capacitor electrodes. After the first isotropic etching, a second isotropic etching is conducted into the polysilicon-comprising support material using a dry etching fluid to expose an elevationally inner portion of the sidewalls of the individual first capacitor electrodes and to stop on the dielectric material. A capacitor dielectric is formed over the outer and inner portions of the sidewalls of the first capacitor electrodes. A second capacitor electrode is formed over the capacitor dielectric.

In some embodiments, a method of forming capacitors comprises forming dielectric material elevationally over node locations. An elevationally inner support material comprising polysilicon is formed elevationally over the dielectric material. An elevationally intermediate support material is formed over the inner support material. An elevationally outer support material comprising polysilicon is formed elevationally over the intermediate support material. The elevationally intermediate material is of different composition than the elevationally outer support material. A covering material is formed elevationally over the polysilicon-comprising outer support material. Individual openings are formed through the covering, outer support, intermediate support, inner support, and dielectric materials to the node locations. A first capacitor electrode is formed within individual of the openings in conductive electrical connection with the respective node locations. Openings are anisotropically etched though the covering material to expose the polysilicon-comprising outer support material. A first isotropic etching is conducted through the polysilicon-comprising outer support material using a liquid etching fluid to expose an elevationally outer portion of sidewalls of individual of the first capacitor electrodes, and to expose and stop on the intermediate support material. After the first isotropic etching, at least some of the intermediate support material is removed to expose the polysilicon-comprising inner support material. After the removing, a second isotropic etching is conducted into of the polysilicon-comprising inner support material using a dry etching fluid to expose an elevationally inner portion of the sidewalls of the individual first capacitor electrodes and to stop on the dielectric material. A capacitor dielectric is formed over the outer and inner portions of the sidewalls of the first capacitor electrodes. A second capacitor electrode is formed over the capacitor dielectric.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming capacitors, comprising:
   forming support material over a substrate;
   forming covering material elevationally over the support material;
   forming a first capacitor electrode within individual openings that extend through the covering material and into the support material;
   after forming the first capacitor electrode within the individual openings, conducting an anisotropic etching step to anisotropically etch openings through the covering material to the support material;
   isotropically first etching only partially into the support material using a liquid etching fluid to expose an elevationally outer portion of sidewalls of individual of the first capacitor electrodes, no additional etching step occurring between said anisotropic etching step and said isotropic first etching using the liquid etching fluid;
   second etching into the support material using a dry etching fluid to expose an elevationally inner portion of the sidewalls of the individual first capacitor electrodes; and forming a capacitor dielectric over the outer and inner portions of the sidewalls of the first capacitor electrodes and forming a second capacitor electrode over the capacitor dielectric.

2. A method of forming capacitors, comprising:
forming support material over a substrate;
forming a first capacitor electrode within individual openings in the support material;
first etching only partially into the support material using a liquid etching fluid to expose an elevationally outer portion of sidewalls of individual of the first capacitor electrodes, the first etching forming the support material to have a jagged non-planar elevationally outermost surface;
second etching into the support material using a dry etching fluid to expose an elevationally inner portion of the sidewalls of the individual first capacitor electrodes; and
forming a capacitor dielectric over the outer and inner portions of the sidewalls of the first capacitor electrodes and forming a second capacitor electrode over the capacitor dielectric.

3. The method of claim 1 wherein the first etching forms the support material to have a planar elevationally outermost surface.

4. The method of claim 1 wherein the first etching exposes less than one-half of all of the sidewalls of the individual first capacitors.

5. The method of claim 1 wherein the first etching exposes more than one-half of all of the sidewalls of the individual first capacitors.

6. The method of claim 1 wherein the support material surrounds the individual first capacitor electrodes, the second etching removing all remaining of the support material from surrounding the individual first capacitor electrodes.

7. The method of claim 1 wherein the support material comprises an elevationally outer material, an elevationally inner material, and an elevationally intermediate material between the outer and inner materials; the intermediate material being of different composition from composition of the outer and inner materials.

8. The method of claim 7 wherein the first etching with the liquid etching fluid is conducted isotropically to stop on the intermediate material.

9. The method of claim 8 wherein the intermediate material surrounds the individual first capacitor electrodes, and removing all remaining of the intermediate material.

10. The method of claim 8 wherein the intermediate material surrounds the individual first capacitor electrodes, and removing only some of the intermediate material surrounding the individual first capacitor electrodes after the first etching to leave intermediate material as part of a finished circuitry construction that comprises the capacitors.

11. The method of claim 1 wherein the individual first capacitor electrodes are formed into conductive electrical connection with respective individual conductive node locations, forming a dielectric material that is elevationally inward of the support material and through which the first capacitor electrodes extend to the node locations.

12. The method of claim 1 wherein the support material comprises polysilicon.

13. The method of claim 1 wherein the support material comprises an elevationally outer material, an elevationally inner material, and an elevationally intermediate material between the outer and inner materials; the intermediate material being of different composition from composition of the outer and inner materials.

14. The method of claim 13 wherein the inner and outer materials are of the same composition.

15. The method of claim 13 wherein the inner and outer materials are of different compositions.

16. A method of forming capacitors, comprising:
forming dielectric material elevationally over node locations;
forming an elevationally inner support material comprising polysilicon elevationally over the dielectric material;
forming an elevationally intermediate support material over the inner support material;
forming an elevationally outer support material comprising polysilicon elevationally over the intermediate support material, the elevationally intermediate material being of different composition than the elevationally outer support material;
forming covering material elevationally over the polysilicon-comprising outer support material;
etching individual openings through the covering, outer support, intermediate support, inner support, and dielectric materials to the node locations;
forming a first capacitor electrode within individual of the openings in conductive electrical connection with the respective node locations;
anisotropically etching openings though the covering material to expose the polysilicon-comprising outer support material;
first isotropically etching through the polysilicon-comprising outer support material using a liquid etching fluid to expose an elevationally outer portion of sidewalls of individual of the first capacitor electrodes, and to expose and stop on the intermediate support material;
after the first isotropic etching, removing at least some of the intermediate support material to expose the polysilicon-comprising inner support material;
after the removing, second isotropically etching into the polysilicon-comprising inner support material using a dry etching fluid to expose an elevationally inner portion of the sidewalls of the individual first capacitor electrodes and to stop on the dielectric material; and
forming a capacitor dielectric over the outer and inner portions of the sidewalls of the first capacitor electrodes and forming a second capacitor electrode over the capacitor dielectric.

17. The method of claim 16 wherein the intermediate material surrounds the individual first capacitor electrodes, the removing being of all the intermediate support material from surrounding the individual first capacitor electrodes.

18. The method of claim 16 wherein the intermediate material surrounds the individual first capacitor electrodes, the removing being of only some of the intermediate material surrounding the individual first capacitor electrodes to leave intermediate material as part of a finished circuitry construction that comprises the capacitors.

19. The method of claim 1 wherein the first etching forms the support material to have a non-planar elevationally outermost surface.

* * * * *